(12) United States Patent
Arnold et al.

(10) Patent No.: US 7,109,410 B2
(45) Date of Patent: Sep. 19, 2006

(54) EMI SHIELDING FOR ELECTRONIC COMPONENT PACKAGING

(75) Inventors: Rocky R. Arnold, San Carlos, CA (US); John C. Zarganis, Redwood City, CA (US); Fabrizio Montauti, Pleasanton, CA (US)

(73) Assignee: WaveZero, Inc., Sunnyvale, CA (US)

( * ) Notice: Subject to any disclaimer, the term of this patent is extended or adjusted under 35 U.S.C. 154(b) by 241 days.

(21) Appl. No.: 10/825,747

(22) Filed: Apr. 15, 2004

(65) Prior Publication Data

US 2004/0231872 A1 Nov. 25, 2004

Related U.S. Application Data

(60) Provisional application No. 60/462,902, filed on Apr. 15, 2003.

(51) Int. Cl.
*H05K 9/00* (2006.01)

(52) U.S. Cl. .................. 174/35 MS; 361/752; 361/753; 174/522

(58) Field of Classification Search ............ 174/35 MS, 174/35 R, 52.2, 52.3; 361/752, 753, 799, 361/800, 816, 818; 257/659, 787, 790
See application file for complete search history.

(56) References Cited

U.S. PATENT DOCUMENTS

| | | | |
|---|---|---|---|
| 4,814,943 A | 3/1989 | Okuaki | |
| 5,355,016 A | 10/1994 | Swirbel et al. | |
| 5,394,304 A | * 2/1995 | Jones | 361/765 |
| 5,468,910 A | 11/1995 | Knapp et al. | |
| 5,559,306 A | 9/1996 | Mahulikar | |
| 5,594,204 A | 1/1997 | Taylor et al. | |
| 5,639,989 A | 6/1997 | Higgins | |
| 5,677,511 A | 10/1997 | Taylor et al. | |
| 5,811,050 A | 9/1998 | Gabower et al. | |
| 6,566,596 B1 | * 5/2003 | Askew | 174/35 MS |
| 6,596,937 B1 | * 7/2003 | Mazurkiewicz | 174/35 R |
| 6,614,102 B1 | * 9/2003 | Hoffman et al. | 257/666 |
| 6,624,353 B1 | 9/2003 | Gabower | |
| 6,643,918 B1 | 11/2003 | Ortiz et al. | |
| 6,686,649 B1 | 2/2004 | Mathews | |
| 6,717,485 B1 | 4/2004 | Kolb et al. | |
| 6,768,654 B1 | 7/2004 | Arnold et al. | |
| 2001/0033478 A1 | 10/2001 | Ortiz et al. | |

FOREIGN PATENT DOCUMENTS

WO    WO 01/28305    4/2001

OTHER PUBLICATIONS

U.S. Appl. No. 09/685,969, filed Oct. 10, 2000, Janik et al.
Fujitsu Microelectronics America, Inc., "The Possibilities are Infinite Fujitsu: ASIC Packaging," product information (2002).
Sato, S. et al., "2nd Level Interconnect Reliability of Ceramic Area Array Packages," presented at Semicon Taiwan (Sep. 23, 1997).

* cited by examiner

*Primary Examiner*—Dean A. Reichard
*Assistant Examiner*—Carmelo Oliva
(74) *Attorney, Agent, or Firm*—Townsend and Townsend and Crew LLP (57) ABSTRACT

The present invention provides methods and devices for shielding an electronic component package. In one embodiment, an EMI shield is integrally formed within the package adjacent the die and grounded. The EMI shield may be a metallized shaped polymer layer and may be disposed fully within the package or it may extend out of the package.

33 Claims, 5 Drawing Sheets

EMI SHIELDING FOR ELECTRONIC COMPONENT PACKAGING

CROSS-REFERENCES TO RELATED APPLICATIONS

The present application claims benefit to provisional U.S. patent application Ser. No. 60/462,902, filed Apr. 15, 2003, the complete disclosure of which is incorporated herein by reference.

The present application is also related to co-pending and commonly owned U.S. patent application Ser. No. 10/825,999, entitled "Electromagnetic Interference Shielding for a Printed Circuit Board", filed herewith, the complete disclosure of which is also incorporated herein by reference.

BACKGROUND OF THE INVENTION

The present invention generally provides shielded semiconductor electronic packages and printed circuit boards. More specifically, the present invention provides an EMI shield integrally formed within a package of a semiconductor electronic component.

Semiconductor electronic components emit electromagnetic radiation, generally in the range of 50 MHz to 3 GHz, depending on the speed of the microprocessor. As can be appreciated, with the advances in high-speed microprocessor design and the rapidly increasing capabilities of high-speed networking and switching electromagnetic radiation will often be above such a range. The problem of emittance of electromagnetic radiation is not new to designers of electronic equipment. Indeed, significant efforts are taken to reduce electromagnetic interference (EMI) and radiofrequency interference (RFI) and virtually every county has a regulating agency (FCC in the U.S., for instance) that regulates the marketing and sale of electronic equipment that do not pass stringent requirements for EMI and RFI, whether radiation is emitted or intercepted (also called susceptibility) by the electronic equipment.

Semiconductor device packages or integrated circuit chip carriers find use in a variety of electronics applications. Integrated circuits or semiconductor electronic components (collectively referred to herein as "electronic package") are typically protected from the external environment by encapsulation with a conformal coating such as an epoxy material, transfer molding, a thermoset, or thermoplastic resin about the electronic component. Such a package provides protection from dust, humidity and other environmental factors, which can destroy or irreparably damage the circuitry of the component. Unfortunately, one problem associated with conventional packaging of the semiconductor electronic component is that such thermoplastic package does not provide shielding from electromagnetic radiation, such as RFI and EMI.

When it comes to EMI shielding at the printed circuit board or "component level," some conventional solutions are to place a conductive surface of an EMI shield in contact with the surface ground traces either (1) directly placing a metal can in contact with a ground trace, (2) directly by metallizing a shield surface and placing it in contact with the ground trace or (3) by metallizing the "outside" surface (from the perspective of the component being shielded) and then using some method of attachment that connects the surface ground trace with the metallized outside surface. Such solutions act to protect the semiconductor electronic component from external RFI and EMI signals and to prevent the escape of RFI or EMI signals generated within the semiconductor electronic package.

The purpose of the surface ground traces, based upon the historical use of soldered metal cans, is to provide a point of contact between the metal can and printed circuit board that can be subject to standardized surface mount technology (SMT) solder reflow processes that ultimately provide a solid and permanent connection between the metal can shield and the printed circuit board.

The resultant assembly of shield and component provides adequate shielding for many applications. However, as the frequency of chips increase (e.g., greater than 3 GHz) and the data transmission rates increase, the creation of errant EMI radiation becomes much easier and more harmful to adjacent circuits and components. Indeed, with the increasing density of chips, the subject of immunity (of one chip relative to another) becomes all the more important. Thus, in general, conventional solutions will increasingly find themselves inadequate for purposes of immunity and indeed, radiated emissions, may also become an increasing issue. Moreover, for microwave devices, especially those that operate at harmonic frequencies above about 10 GHz., radiated emissions will be a significant concern.

In virtually all cases, the existing solutions are expensive and add to the cost of manufacturing electronic equipment such as cell phones, personal digital assistants, laptop computers, set-top boxes, cable modems, networking equipment including switches, bridges, and cross-connects. Moreover, as the density of electronic components on the printed circuit board increases, it may become difficult to find space on the printed circuit board to mount the EMI/RFI shields.

Therefore, a need still exists for a method to provide a low profile EMI/RFI shielding to integrated circuit packages on the printed circuit board.

BRIEF SUMMARY OF THE INVENTION

The present invention provides shielded packages, shielded electronic components and printed circuit boards, and methods of manufacturing In one aspect, the present invention provides a shielded electronic package. The electronic package comprises a die and a substrate comprising a plurality of traces. A plurality of leads (e.g., wires, solder balls, etc.) that electrically couple an active surface of the die to the plurality of traces in the substrate. External solder ball contacts are coupled to the traces in the substrate. The solder ball contacts extend from a surface of the substrate and are configured to be coupled to conductive leads on a printed circuit board. A conductively coated polymer shield defines a cavity around at least a portion of the die and the plurality of leads. The conductively coated polymer shield is electrically coupleable to a ground trace. An insulative conformal coating is disposed over the conductively coated polymer shield so as to encapsulate the die and plurality of leads. The insulative conformal coating leaves the external solder ball contacts exposed.

In one embodiment, the ground trace is disposed on the substrate of the electronic component. Such a ground trace may be in electrical communication with some of the external solder ball contacts. The contacted solder ball contacts may then electrically contact grounded element in/on the printed circuit board.

In another embodiment, the ground trace may be disposed directly on the printed circuit board. In such embodiments, an end portion of the conductively coated polymer shield may extend beyond an outer surface of the conformal coating and the substrate, and may be configured to contact the surface ground trace on the printed circuit board.

The conductively coated polymer shield of the present invention may take on a variety of different forms. In one embodiment, the conductively coated polymer coated shield comprises a top surface and a plurality of side walls that extend at an angle from the top surface. A flange extends at an angle from the side walls in a plane that is substantially parallel with the first surface of the substrate.

The conductively coated polymer shield typically comprises at least one thermoplastic resin layer and at least one metal layer on at least one surface of each of the resin layers. In one configuration, the resin layer comprises a high temperature thermoformable film and has one metal layer that is disposed on an inner surface and faces the die and substrate. The metal layer(s) may have any thickness, but is typically between about 1 micron and about 50 microns, and preferably less than about 3 microns.

While the metal layer may be applied to the resin layer using any conventional method, one preferred method is through vacuum metallization. Applicants have found that vacuum metallization provides a substantially even thickness of metal over the entire shaped resin layer.

Optionally, the conductively coated polymer shield comprises a plurality of apertures. The apertures are typically positioned to allow the plurality of leads to be electrically coupled to the plurality of traces in the substrate.

The conductively coated polymer shield may be used to create a spacing between the conformal coating and the die. Such a spacing may reduce the mechanical stress and thermal mismatch stress between the die and conformal coating. Optionally, a filler material may be positioned within the spacing adjacent the die. The filler material may have a coefficient of thermal expansion that is similar to the coefficient of thermal expansion of the electronic die that it encapsulates. Alternatively, the filler material may have a coefficient of thermal expansion that is higher or lower than the die, (e.g., similar to the conformal coating).

In some embodiments, a heat sink or heat spreader may be positioned in the space and in contact with the die. The heat sink/heat spreader will be used to dissipate heat that is generated by the die. In some configurations, apertures or vias may be formed in the heat sink/heat spreader and the conductively coated polymer shield. Such apertures may be filled with the conformal coating so as to anchor the shield and heat spreader. As can be appreciated, the apertures will be of a small enough size that prevents electromagnetic interference from escaping.

In another aspect, the present invention provides a shielded package comprising a die that has an active surface and a substrate comprising a plurality of traces. A plurality of leads electrically couple the active surface of the die to the plurality of traces in the substrate. External contacts are coupled to the traces in the substrate. The external contacts are configured to be coupled to conductive leads on a printed circuit board. A conductively coated polymer shield defines a cavity around at least a portion of the die. The conductively coated polymer shield is electrically coupleable to a ground trace in the substrate. A filler material is disposed within the cavity defined by the conductively coated polymer shield. A conformal coating is disposed over the conductively coated polymer shield so as to encapsulate the die and plurality of leads, wherein the insulative conformal coating leaves the external solder ball contacts exposed.

The filler material may comprise a variety of different materials. In one embodiment, the filler material is a multi-component mixture of resin and other additives used to encapsulate different entities. These mixtures typically comprises of resin and curing agents or hardeners. Other additives may consist of flame-retardants, stress-relief additives or coloring agents. The filler material may be selected to have a coefficient of thermal expansion that is substantially similar to the die.

The conductively coated polymer shield typically comprises a thermoplastic resin layer and at least one metal layer on at least one surface of the resin layer. In one configuration, the polymer shield comprises a top surface and a plurality of side walls that extend at an angle from the top surface. A flange extends at an angle from the side walls in a plane that is substantially parallel with the first surface of the substrate.

In a further aspect, the present invention provides a method of manufacturing a shielded packaging. The method comprises providing a substrate comprising a plurality of leads. An active face of a die is electrically coupled to the plurality of leads. A conductively coated resin layer is coupled to the substrate so that the die is positioned in a cavity between the substrate and the conductively coated resin layer. The conductively coated resin layer is grounded and a conformal coating is applied over at least a portion of the conductively coated resin layer so as to encapsulate the die and at least a portion of the substrate.

The method may further comprise forming the conductively coated resin layer by shaping a resin layer and depositing at least one conductive layer onto at least one surface of the shaped resin layer. In preferred embodiments, the conductive layer is a metal layer that is vacuum metallized onto the shaped resin layer.

Optionally, the cavity may be filled with a filler material, such as a resin with a curing agent with or without additives for enhanced performance such as a flame-retardant. Typically filling or potting compounds will offer a low-viscosity, a long working life, low curing temperatures, good adhesion to the entities in which it encapsulates, low stresses, and good electrical insulation. Alternatively, a heat sink or heat spreader may be coupled to the die so as to help dissipate heat created by the die.

In one configuration, rounding the conductively coated resin layer comprises extending a portion of the conductively coated resin layer outside of the conformal coating and contacting the conductively coated resin layer to a ground trace on a printed circuit board.

The present invention further provides a printed circuit board. The printed circuit board comprises any of the shielded electronic packages described herein that have an integrally formed EMI shield within the packaging. The printed circuit board comprises a grounding element that is electrically coupleable to the shield that within the package.

The present invention further provides electronic devices that encompass the printed circuit boards of the present invention. The electronic device may comprise a computer, a cellular phone, a personal digital assistant, network devices and routers, or the like.

A further understanding of the nature and advantages of the invention will become apparent by reference to the remaining portions of the specification and drawings.

DETAILED DESCRIPTION OF THE INVENTION

Figure 1:
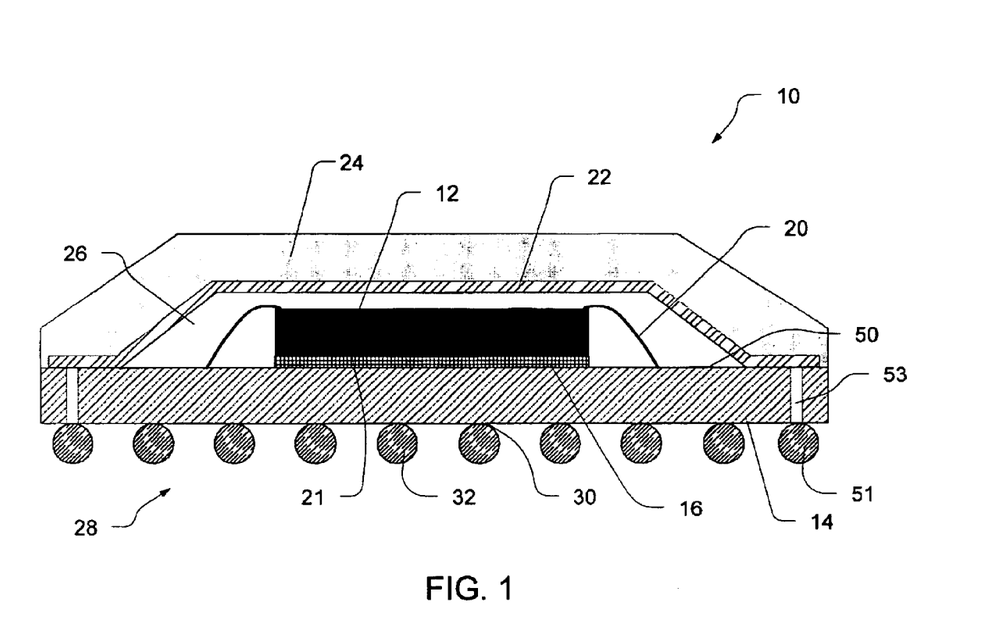
FIG. 1 is a cross-sectional view of one electronic package that is encompassed by the present invention.

FIG. 1 illustrates one electronic package 10 that is encompassed by the present invention. The package 10 comprises a die 12 positioned on a die pad of a substrate 14. Die 12 is typically coupled to the die pad with an adhesive layer 16. The die is electrically coupled to conductive traces (not shown) on the substrate 14 with a plurality of conductive elements 20 such as an array of wires or an array of solder balls. If the conductive elements 20 are solder balls, such solder balls will typically be disposed on an underside 21 (which would be the active face) of the die and may be used to attach die 12 to the traces of substrate 14. In such an embodiment, the adhesive 16 is typically not necessary, but a non-conductive adhesive or other material may be used to insulated conductive elements from each other and to provide mechanical support for the die.

A spacing element insert 22 may be positioned over die 12 and be coupled to a portion of substrate 14. A conformal coating 24 is applied over the spacing element 22 to encapsulate and seal the die 12 and conductive elements 20 from environmental contamination, such as water, dust, and the like. Conformal coatings are generally epoxy resins that typically comprise both a resin, based upon etho-xylene polymer chemistry, and a reactive hardener to increase linear polymerization and cross-linking of the epoxy. Resin systems are relatively low in viscosity and contain low-loss filler for improved physical characteristics. Epoxy castings, which are shrink free, void free and low in thermal expansion, are easily prepared according to methods known in the art.

Spacing element insert 22 may create an air cavity or a space 26 between mold resin or conformal coating 24 and die 12 and conductive elements 20. Since die 12 and conductive elements 20 are spaced from conformal coating 24, concerns about mechanical stress and thermal mismatch stress between the die and conformal coating may be reduced. Optionally, a filler material, heat sink, or underfill (not shown) which is typically an epoxy based material that penetrates sub-mil gaps easily and offers excellent temperature and chemical resistance may be placed in the air cavity 26. The fill material may be more flexible than conformal coating 24 (e.g., have a coefficient of thermal expansion that is closer to that of the die) or it may have a flexibility that is substantially similar to the conformal coating 24. The fill material may be chosen so that the coefficient of thermal expansion is closer to the coefficient of thermal expansion of die 12, so as to reduce the mismatch of coefficients of thermal expansion with die 12. Dependant on the base polymer resins used in the underfill, coupled with the various additives and inserts that can be combined with the resin, underfills with a variety of thermal coefficients can be chemically engineered to fit almost any application An array of external conductive leads 28 are coupled to conductive traces/pads 30 on substrate 14 and are exposed from the packaging 10 and are configured to electrically contact an array of leads on a printed circuit board (not shown). The array of conductive leads 28 may take on a variety of forms—such as surface mount leads or insertion type leads. For example, in the illustrated embodiment, the plurality of conductive leads 28 comprise a plurality of pads 30 that comprise solder balls or solder bumps 32. In other embodiments, the leads 28 may take on the form of a lead from that has ends that are gull wing shaped (L shape) or J-shaped.

Figure 2:
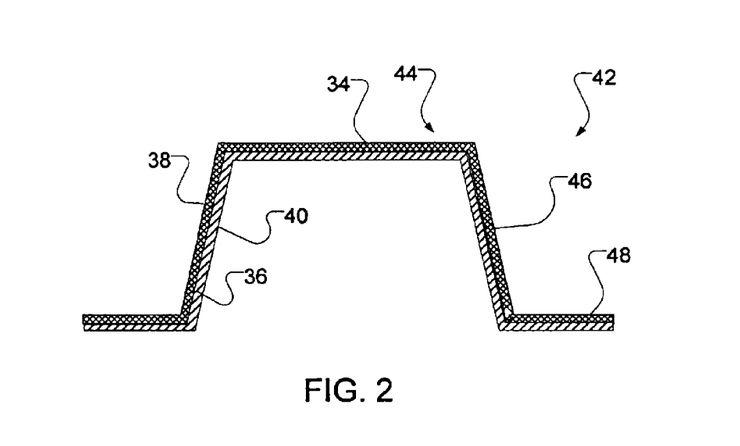
FIG. 2 is a cross-sectional view of another electronic package that is encompassed by the present invention.

FIG. 2 illustrates a simplified cross-sectional view of a spacing element insert that is encompassed by the present invention. Spacing element may be shaped to define one or more compartments that receive and shield the die(s) on the substrate. In embodiments in which the spacing element insert has multiple compartments for multiple dies, each of the compartments will typically be sized and shaped to separate the dies from each other and from the conformal coating. As such, the spacing element insert may take on a variety of shapes, sizes and forms so as to conform to the specific shape and configuration of the package. Optionally, spacing element insert may include a plurality of apertures. The apertures may be for ventilation, heat dissipation or of allowing leads to extend through the insert.

Spacing element insert typically comprises at least one polymer layer 34, such as a thermoplastic resin layer or a thermoset resin that can be formed by a variety of plastic processing methods to a desired shape to partially or fully enclose die 12. In exemplary embodiments, the polymer layer 34 is a thermoformable plastic that is shaped using thermoforming techniques (e.g., vacuum, pressure, or mechanical forces). It should be appreciated however, that the polymer layer 34 may be shaped using any conventional or proprietary methods. Polymer layer 34 may be composed from any number of polymers, including but not limited to PBT, polycarbonate, Ultem®, Teflon®, Kapton®, polypyrroyle, fluorocarbons, polymers filled with glass or other substances, unfilled polymers, or the like.

In one preferred embodiment, the polymer layer comprises a thermoplastic resin. Thermoplastic resins are polymer materials capable of softening or fusing when heated and of hardening again when cooled. Thermoplastics are generally more rigid or molten during the forming stage which offer a wider range of processing and forming techniques such as vacuum forming or injection molding. This makes thermoplastics better suited for forming enclosures such as EMI shields.

In alternative embodiments, thermosets are polymer materials that become permanently rigid when heated or cured. Thermosets offer the advantage of having a liquid form prior to the heating or curing cycle. As a result, thermosets are well suited for use as potting materials for filling cavities or encapsulating other embodiments which is typically why thermoset materials are chosen for underfill or to encapsulate dies. Thermosets are often capable of withstanding higher temperatures than a wide range of their thermoplastic counterparts.

If EMI shielding is desired, spacing element insert 22 may include at least one conductive layer 40, such as a metal layer (e.g., aluminum, copper, etc.) on at least one of the inner surface 36 and an outer surface 38 of the polymer layer 34. As an alternative to a metal layer, conductive layer 40 may be comprised of conductive adhesives such as silver filled epoxies or silicones, carbon filled epoxies or silicones, or conductive paints (paints filled with conductive particulates) or the like. In exemplary embodiments conductive layer 40 is a metal layer that have a thickness that is sufficient to block the transmission of EMI, typically between about 1 micron and about 50 microns, preferably less than about 3 microns, but it could be more or less, as desired. For example, if a conductive paint is used, the layer will often have a thickness that are between about 7 microns and about 10 microns, or thicker In the illustrated embodiment, a first conductive layer 40 is disposed on inner surface 36 of polymer layer 34. The combination of the thermoplastic resin layer 34 and the one or more conductive layers 40 is referred to herein as an "EMI shield" 42.

While not shown, it should be appreciated that EMI shield 42 may have a conductive layer disposed on both inner surface 36 and outer surface 38. The two conductive layers may comprise the same or different materials and may have the same or different thickness. Moreover, if desired each surface 36, 38 may have more than one layer of material deposited thereon. The different layers may have the same or different thicknesses and may be composed of the same or different materials.

EMI shield 42 may optionally comprise one or more ventilation holes (not shown) to allow for ventilation and heat dissipation. As can be appreciated, such holes will typically be small enough so as to substantially prevent the target electromagnetic radiation from being transmitted through the holes.

The conductive layers 40 of the present invention are typically applied to the polymer layer 34 after shaping of the polymer layer. If the conductive layer 40 is applied prior to shaping of the thermoplastic resin layer 34, the shaping process (e.g., thermoforming) tends to stretch out and weaken portions of the conductive layer 40. Such stretching and thinning has been found to weaken and sometimes destroy the EMI shielding capabilities of the conductive layer 40. The EMI shields 42 of the present invention will generally have a substantially even thickness in the conductive layer that is sufficient to block the passage of EMI. A more detailed description of some embodiments of an EMI shield 42 that may be used with the present invention are described in commonly owned U.S. Pat. No. 5,811,050 and commonly owned U.S. patent application Ser. No. 09/788, 263, filed Feb. 16, 2001, U.S. patent application Ser. No. 09/947,229, filed Sep. 4, 2001, U.S. patent application Ser. No. 09/685,969, filed Oct. 10, 2000, and PCT Patent Application No. 00/27610, filed Oct. 6, 2000, the complete disclosures of which are incorporated herein by reference.

Typically, the conductive layer 40 is deposited onto one or more surfaces of the polymer layer using vacuum metallization. Vacuum metallization is one preferred method because of the substantially even layer of metal that can be applied to the shaped resin layer 34 to create the EMI shield 42. It should be appreciated however, that other methods of depositing the conductive layer to the polymer layer could be used without departing from the scope of the present invention. For example, instead of vacuum metallization, other methods such as a depositing a random mat or fiber weave, sputtering, painting, electroplating, deposition coating, electroless plating, laminated conductive layers, and the like, may be used to deposit the metal layer onto the shaped resin film layer.

In the illustrated embodiment of EMI shield 42, the EMI shield comprises a top surface 44 and a plurality of side walls 46. A flange 48 may extend laterally from the plurality of side walls 46 and extends in a plane that is substantially parallel with a top surface 50 of substrate 14. In preferred embodiments, the top surface, side walls and flange are metallized on at least one surface. While the side walls 46 are illustrated to be at a non-orthogonal angle from the top surface 44, it should be appreciated, that the top surface 44, side walls 46 and flange 48 may be at any desired angle from each other. Furthermore, in some embodiments, there may not even be a top surface, and the EMI shield 42 may be shaped to define a semi-spherical space 26

Referring again to FIG. 1, if a metal can EMI shield (not shown) is used in place of the conductively coated polymer EMI shield 42, the metal can may be coupled to a grounding lead 51 on the substrate 14 through via 53 using a solder reflow process. However, since the melt temperature of the polymer layer 34 is usually lower than the reflow temperature of the solder, the reflow process is generally not applicable to resin based EMI shields. As such, a conductive adhesive may be used to ground the conductive layer 40 of EMI shield 42 to a grounding lead 51 on substrate 14. The conductive adhesives generally comprise of, but are not limited to, epoxies filled with silver, copper, carbon or other conductive particulates, or silicones filled with silver, copper, carbon or other conductive particulates or the like.]

While not shown, if the EMI shield 42 contains a flange 48, holes may optionally be selectively placed on the flange 48 where either conductive or nonconductive adhesive or similar conductive material (even solder) could be placed over the holes to electrically couple the flange 48 to the vias 53, grounding lead 51 on substrate 14 or a grounded layer in/on printed circuit board. Such a configuration is particularly beneficial when a metal layer is placed on the outside surface 38 of EMI shield 42 so that the conductive adhesive creates an electrical path to the metal layer on the outside surface 38 of the EMI shield 42 to the ground trace.

Figure 3:
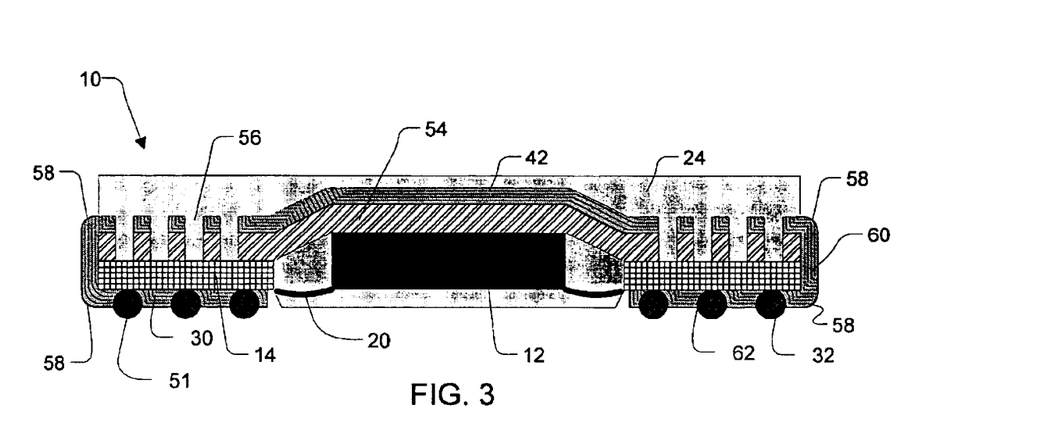
FIG. 3 is a cross-sectional view of yet another electronic package that is encompassed by the present invention.

FIG. 3 illustrates another embodiment of a package 10 that is encompassed by the present invention. The illustrated embodiment is a face down ball grid array package (BGA). In this embodiment an EMI shield 42, typically in the form of a metallized thermoform and is at least partially encapsulated in the conformal coating 24. A heat sink or heat spreader plate 54 may optionally be positioned between EMI shield 42 and die 12 and within the compartment that is defined by EMI shield 42. Heat spreader plate 54 may be used to dissipate heat generated during the normal operation of die 12. While the heat generated by die 12 can achieve temperatures in excess of 70° C. in many applications, it should be appreciated that EMI shield 42 may be fabricated from any number of polymers, including but not limited to PBT, polycarbonate, Ultem®, polymers filled with glass or other substances, or unfilled polymers suitable for withstanding elevated temperatures in excess of 70° C. often up to temperatures around 160° C. during the soldering stages the package 10 often undergoes. Heat spreader plate 54 is generally made from copper, nickel, tin or a combination thereof. Heat spreader plate 54 should be positioned in direct contact with the electronic die to provide the most efficient heat transfer away from the die.

In the illustrated embodiment, heat spreader plate 54 and EMI shield 42 may optionally be held in place on substrate 14 by conformal coating 24, which passes through anchor holes 56 in both heat spreader plate 54 and EMI shield 42. In this configuration, EMI shield 42 may be designed to extend beyond the outer surface or perimeter of conformal coating 24 and substrate 14. EMI shield may optionally comprise living hinges 58 that will allow extensions 60 of the EMI shield to bias toward a folded configuration underneath package 10 and so as to partially or fully encapsulate die 10 from an EMI shielding perspective. Folded under extensions 60 may be held in place over pads 30 by solder ball leads 32. Solder ball leads 32 may be disposed within holes 62 in extensions 60, that are similar to fill holes 56, so as to expose pads 30. As can be appreciated solder balls 32 will be exposed and generally not in electrically contact with the metal layer of EMI shield 42. Solder ball leads 32 may be comprised of a metal (e.g., tin and its alloys, lead and its alloys, silver and its alloys, nickel and its alloys, or a combination thereof). Alternatively, ball leads 32 may comprise adhesive (silver filled epoxy or silicon, carbon filled epoxy or silicon, and the like) or other materials capable of maintaining a mechanical and electrical bond between pads 30 of package 10 and the printed circuit board (PCB, not shown) and the electrical traces the printed circuit board generally will contain.

In the embodiment of FIG. 3, EMI shield 42 may be grounded to a ground trace on substrate 14 through an electrical connection to solder ball ground traces 51. In another embodiment, unlike the rest of solder balls 32, ground trace solder ball 51 may be contacted against the metal layer of EMI shield by making the holes 62 small enough to allow contact between the conductive layer on EMI shield 42 and at least one of pad 30 and ground trace solder ball 51. In another embodiment, EMI shield 42 could make electrical contact to a ground trace on substrate 14 through heat spreader plate 54. In this embodiment, the metal layer of EMI shield 42 would be in direct contact with the conductive heat spreader plate 54 which in turn could be designed in a fashion that would selectively contact exposed ground traces on substrate 14.

While not shown, it may be possible to have extensions 60 be of a length that substantially encapsulates the die 12 on all sides. In such embodiments, extensions 60 will extend all the way around a bottom surface of package 10 and contact each other beneath the die. Furthermore, while the conformal coating 24 is illustrated to completely encapsulate the top surface of EMI shield 42, to reduce the vertical size of the package 10, the conformal coating may cover only the sidewalls and a portion of the flange of EMI shield. In such embodiments, the top surface of the EMI shield 42 may define a top surface of the package 10.

Figure 4:
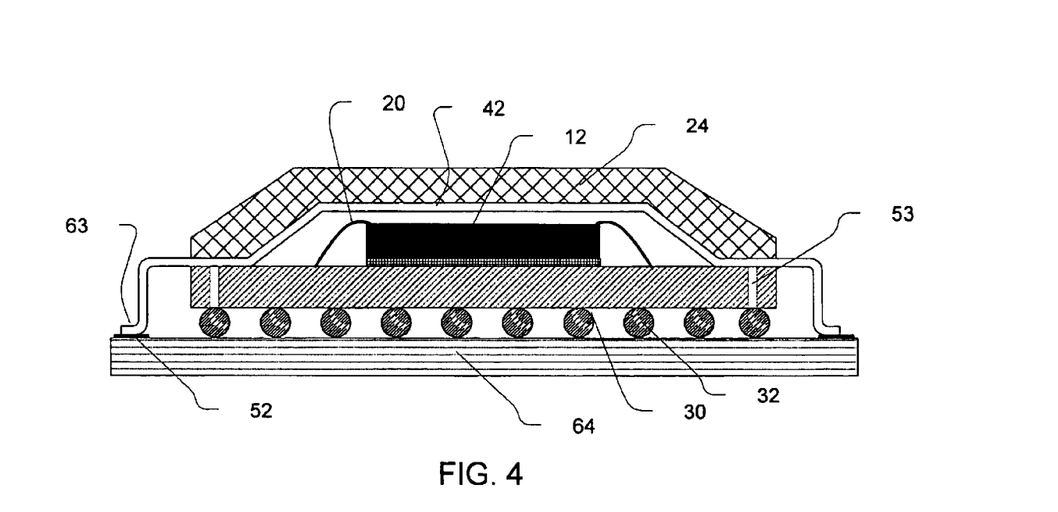
FIG. 4 is a cross-sectional view of a further electronic package that is encompassed by the present invention.

FIG. 4 illustrates another embodiment of a package 10 that is encompassed by the present invention. In the embodiment of FIG. 4, EMI shield 42 is positioned over die 12 and is partially encapsulated by conformal coating 24. EMI shield 42 defines a cavity around die 12 so as to separate conformal coating 24 from die 12 and the plurality of wires 20. Die 12 is coupled to substrate 14 with a non-conductive adhesive 16. Solder ball bumps 32 may be attached to pads 30 of substrate 14 so as to provide electrical contacts for connection to a printed circuit board 64.

While not shown, instead of the wires 20 and adhesive 16, die 12 may be flipped over, such that the active face of die 12 is adjacent substrate 14 and the active face may be coupled to the traces on the substrate 14 through solder ball bumps.

In the embodiment of FIG. 4, ends 63 of EMI shield 42 may extend laterally beyond an outer perimeter of substrate 14 and conformal coating 24. The ends 63 of EMI shield 42 may be sized and shaped to make contact with a surface ground trace 52 on the printed circuit board 62. Ground trace 52 may be a ring ground trace that extends substantially around the package 10 on the printed circuit board, or the ground trace 52 may simply be a contact or via that extends down to an internal ground plane within the printed circuit board 64. The ends of EMI shield 42 may take on a variety of shapes. In one embodiment the ends may be "J" shaped, gull wing shapes (L shape). Alternatively, ends 63 may comprise a conductive adhesive or solder ball bump.

Figure 5:
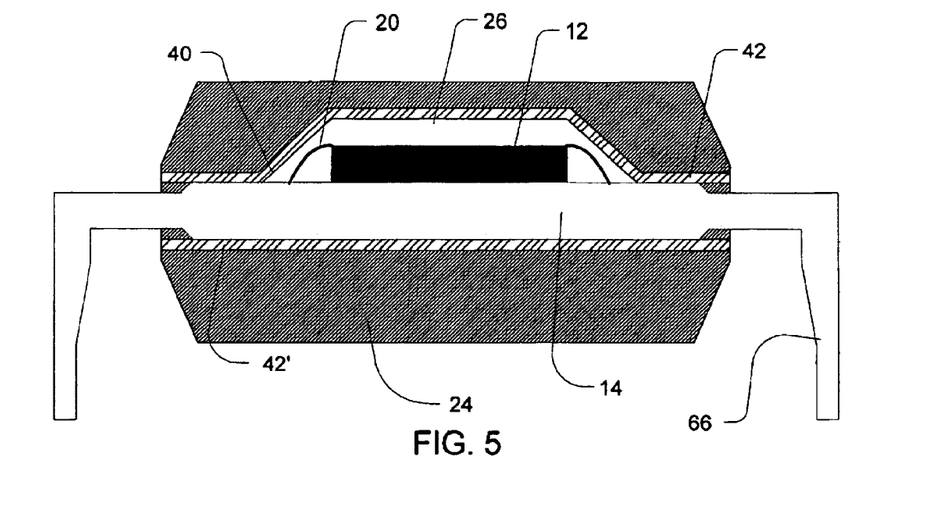
FIGS. 5 and 6 illustrate an electronic package that comprises an integral first and second EMI shield.
Figure 6:
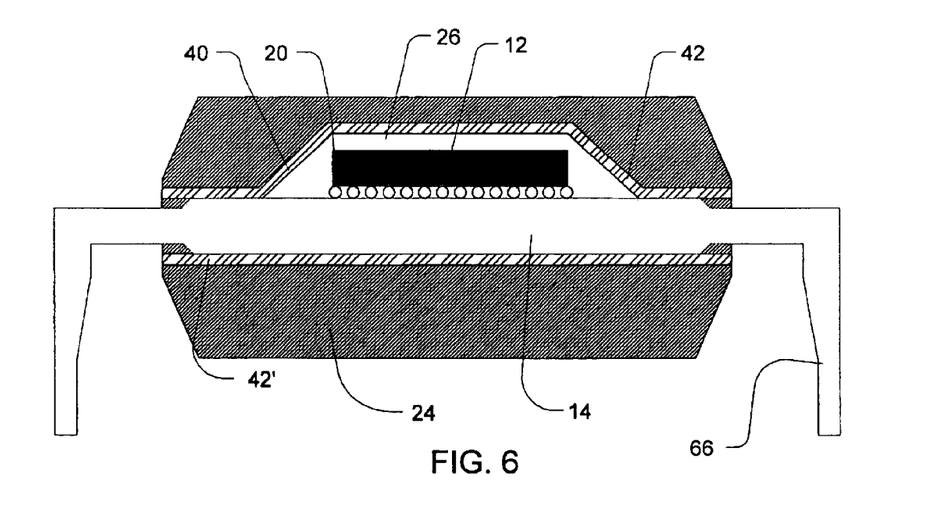

FIGS. 5 and 6 illustrate other embodiments of packages 10 that are encompassed by the present invention. Instead of having solder ball terminals 32, the illustrated embodiments have lead frames 66 that have conductive leads that extend laterally away from package 10 and toward the surface of the printed circuit board. Similar to the previous embodiments, package 10 comprises an active face of die 10 that is coupled to the substrate 14. In FIG. 5, the active face of die 12 is electrically and mechanically coupled to conductive traces in the substrate through solder ball conductive elements 20. While not shown, a non-conductive encapsulating filler material may be disposed between the adjacent solder ball conductive elements 20 to prevent electrical contact between the solder ball conductive elements and to improve the mechanical connection between die 12 and substrate 14. The encapsulating filler material may be the same material as the conformal coating 24 or a different material, as described above. The filler material may also provide additional protection from environmental dirt and moisture and improved electrical insulation. In FIG. 6, the active face of die 12 is electrically coupled to conductive traces in the substrate 14 through elongate wire conductive elements 20 and is mechanically coupled to substrate 14 with an adhesive 16.

In the illustrated embodiment, there are two EMI shields 42, 42' that are positioned within packaging 10. Similar to the embodiments of FIGS. 1, 3, and 4, the first EMI shield 42 is positioned over and around die 12 and conductive elements 20 so as to encompass the die and conductive elements in the cavity 26. The first EMI shield 42 may be grounded to a grounded trace, via or other grounding element, as is described above. Typically, the conductive coating 40 of EMI shield 42 is contacted against a grounding via or pin on the substrate. In other embodiments, a designated wire bond could extend from die 12 to provide the necessary grounding contact between EMI shield 42,42' and die 12.

The second EMI shield 42' may be positioned on an opposite side of substrate 14 from the die and mechanically and electrically coupled to a grounding element (e.g., grounded trace, via, or pin). In such an embodiment, the die 12 will be shielded on both a top surface and a bottom surface.

In both FIGS. 5 and 6, conformal coating 24 is applied over both sides of substrate 14 so as to encapsulate the substrate 14, die 12, conductive elements 20, and the EMI shields 42, 42'. Optionally, a filler material (e.g. heat sink, heat spreader, etc.) may be positioned within the cavity 26 adjacent the die.

Figure 7:
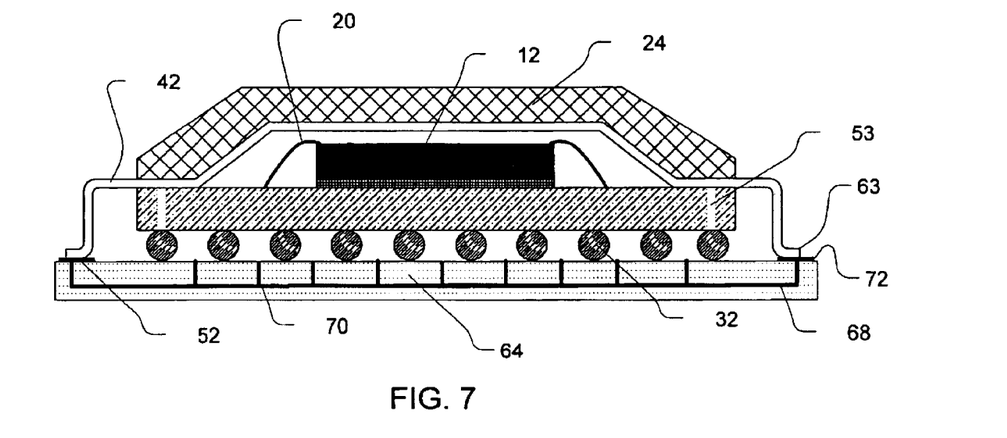
FIGS. 7 and 8 illustrate two electronic packages that are positioned on a printed circuit board and grounded to a grounded layer through a series of strategically formed vias.
Figure 8:
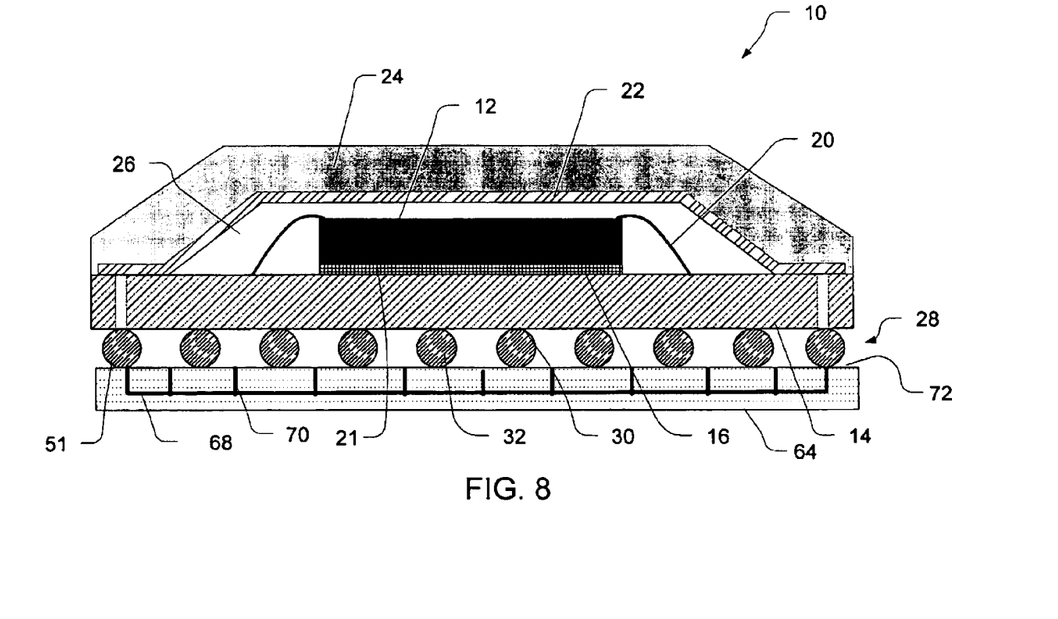

FIGS. 7 and 8 illustrate a combination of an electronic component package 10 in combination with a modified printed circuit board 64. Printed circuit board 64 comprises conductive traces superimposed or printed on one or both surfaces (not shown) and may also contain internal signal layers (not shown), power planes (not shown) and one or more ground planes 68. Printed circuit board 64 comprises one or more layers of insulative organic or inorganic material containing the pattern(s) of conductive traces. Printed circuit board 64 becomes an electrical circuit when packages 10 (e.g., an electronic component) are attached and soldered to one of the printed circuit board's surfaces and leads from the electronic component are contacted with the conductive traces in the printed circuit board 64.

While printed circuit board 64 may be composed of a single epoxy sheet, most printed circuit boards of the present invention are composed of a two or more epoxy resin layers, and typically between two layers and sixteen layers, or more. As can be appreciated, the printed circuit board's 64 of the present invention may comprise hundreds of layers or more, if desired.

The substrate of the printed circuit board 64 typically comprises an insulative and substantially non-flexible substrate. The thin conductive traces or wires that are disposed on the surface of at least some of the substrate layers of the printed circuit board 64 may be formed from part of a copper foil that initially covers a surface of printed circuit board 64. The copper foil may be partly etched away, and the remaining copper forms a network of thin wires that form the conductive traces and provide the electrical connections between the various packages 10 mounted on the surface of the printed circuit board 64. As can be appreciated, the conductive leads may be formed on the surface of the substrate of the printed circuit board using any accepted method.

Some printed circuit boards 64 have electronic packages 10 mounted on only a first surface of printed circuit board 64 and the conductive traces on the second surface. Double sided printed circuit boards 64 have conductive traces on both the first and second surfaces of the printed circuit board 64. If there are conductive traces on both surfaces of printed circuit board 64, an electrical bridge between the two surfaces may be needed. Such electrical bridges may comprise vias. A via 70 is a hole in the printed circuit board 64 that is filled or conductively plated with metal or other conductive materials and extends through at least one layer of printed circuit board 64 While not shown in FIGS. 7 and 8, when there are multiple layers of conductive traces, printed circuit board 64 may comprise buried or blind vias that extend through less than all of the layers of printed circuit board.

To increase the number of conductive traces on the printed circuit board 64, two or more double-sided layers may be coupled together with insulating layers in between the layers. To more clearly show the novel aspects of the present invention, the figures only illustrate a one-sided board, but it should be appreciated that the present invention is equally applicable to double sided printed circuit boards.

In multi-layer printed circuit board 64, one or more layers may be dedicated to ground planes 68 and power planes (not shown). In some embodiments, there may be more than one of the power planes and/or ground planes 68. A plurality of conductively coated or filled vias 70 may be selectively formed in the printed circuit board 64 so that at least some of vias 70 extend from a grounded layer (e.g., ground plane 68) to a first external surface 72 of printed circuit board 64. As can be appreciated, not all of the vias 70 in printed circuit board 64 need to extend to first external surface 72. Moreover, some of vias 70 may be used to interconnect one grounded layer (not shown) to another grounded layer, such as the ground plane 68. Furthermore, depending on the configuration of the printed circuit board, the plurality of vias 70 may be electrically coupled to different grounded layers. Vias 70 will not be in contact with any of the conductive leads, but will instead provide an electrical connection between an internal grounded layer 70 and the EMI shield 42.

Typically, vias 70 extend substantially orthogonal from a plane of the first surface 72 of the printed circuit board 64 to the grounded layer 68 and are formed using conventional methods. Vias 70 may be created in the layers of printed circuit board 64 so that one end of the via extends to the first external surface 72 to provide a topside surface to which an electrical connection to the EMI shield 42 is possible. At least a portion of the conductive via 70 may be in contact with grounded layer 68. Consequently, when an EMI shield 42 is conductively contacted with the via 70 on the first external surface 68, the EMI shield 42 will be grounded.

Vias 70 are preferably created in the printed circuit board 64 in a pattern so as to reduce the amount of electromagnetic radiation from escaping through the network of vias. The network of vias usually provides between as few as 4 vias and as many as several hundred vias that extend from the first surface 68 down to a grounded layer 68 around each electronic package 10. Typically, the vias will be formed in a shape that corresponds to the shape of the perimeter of the shield, so as to provide a via-shield grounding contact along the perimeter of EMI shield 42 that extends out of package 10. Thus, the shape and position of the network of vias and ground plane will depend on the shape of the corresponding EMI shield and package placement on the printed circuit board (e.g., if the shield perimeter is round, the vias will be positioned in a circle around the electronic component; if the shield perimeter is rectangular, then the vias will be positioned in a rectangle around the electronic component).

Typically, the number of vias utilized is determined by the operating frequency of the electronic package 10 or any harmonic frequencies thereof. In the case of higher operating frequencies, too few vias would potentially allow radiation to leak through between the vias 70. At higher frequencies, wavelengths of the radiation are shorter and are able to leak out in between smaller spaces. Therefore if there are too few vias present, then the vias 70 will be spaced further apart from one another and would allow for more electromagnetic radiation to leak through.

On the other hand, vias are inherently capacitive and can change the desired impedance of the conductive traces on the printed circuit board. Too many vias 70 could distort data or transmissions traveling across the conductive traces or could possibly affect rise times (e.g., time required for a pulse to change from a low voltage level to a high voltage level). However, some experiments have shown that the effect of the first via added is large, but the impact of subsequent vias tends to diminish as more vias are added to the printed circuit board.

Thus, the number and locations of the vias 70 are dependent on the operating frequencies of the electronic packages disposed on the printed circuit board that is being shielded. Preferably, the vias are placed a distance apart from one another that is approximately equal to between about ½ and about ¼ of the wavelength of the highest frequency or harmonic thereof so as to create an effective EMI shield and prevent radiation from leaking out from between the vias 70. For example, in some embodiments, the adjacent vias may be positioned between about 1 mm and about 100 mm apart from each other. As can be appreciated, for different frequencies, the spacing may be larger or smaller.

Typically, vias are plated with copper, nickel, gold, silver, tin or solder (e.g., a tin/lead combo), and the like. Vias may be plated through an electroless or an electrolytic plating process. The plating may extend through the vias 70 and be exposed on the external flat surfaces 72 of the printed circuit board which would allow a small ringlet of the conductive surface of the via 70 to be exposed and allowed to make contact with the EMI shield 42 or ground trace 52.

The diameters of vias can range between about 0.015" and about 0.040" in some cases. As can be appreciated, the smaller the diameter of the vias, the more expensive it typically is to manufacture the printed circuit board. In addition, if the hole diameter is too small, it may be difficult to conductively plate the entire depth of the via. If the diameter of the hole is too large, when solder is applied to the PCB it may well up and create a bump of solder on the board, which may be undesirable.

The number of the vias positioned along each side of an EMI shield 42 typically depend on the operating frequency of the electronic packages being shielded. The higher the frequency, the closer the vias would be placed together and therefore the more vias would be placed along each side of the shield.

As can be appreciated, the height of the vias 70 is dependant on the number of layers on the printed circuit board and how many layers the via would need to pass through to reach the ground plane 68. For instance, a 4 layer printed circuit board is typically 0.064" thick total (~0.016" per layer). Vias 70 could pass between 1 layer or between all 4 layers. This same would hold true for printed circuit board's with higher numbers of layers.

Vias 70 may be electrically coupled to one or more grounded layers 68. Grounded layer 68 may be a ground plane of the printed circuit board or it may be a layer, trace, or a portion of a layer that is electrically coupled to the ground plane. As can be appreciated, printed circuit board 64 may comprise one or more ground planes. The grounded layer may be grounded (e.g., coupled to the ground plane with buried vias or blind vias) through any conventional or proprietary methods. For example, in an embodiment in which ground plane is coupled to a bottom substrate layer (or other substrate layer), printed circuit board 64 may comprise an intermediate grounded layer 56 in which some or all of vias 70 are coupled to. Thereafter, one or more vias 70 may electrically couple the intermediate grounded layer 56 to the ground plane.

As shown in FIG. 7, the plurality of vias 70 form an interconnected network of spaced conductive elements that extend throughout the inner structure of printed circuit board 64 to form an open, mesh-like bottom EMI shield for the electronic package 10. When connected with an external EMI shield 42, the combination provides an EMI shield that substantially wholly surrounds die 12 and conductive leads 20 and reduces the emittance of electromagnetic radiation to surrounding electronic components. The top of the EMI shielding (e.g., EMI shield 42) is solid, while the bottom portion is open (e.g., the conductive vias 70 and grounded layer(s) 68 and is more of a mesh or cage). The spacing between the vias are small enough to substantially reduce the amount of electromagnetic interference that would escape.

Optionally, printed circuit board 64 may comprise surface ground traces 52 that are positioned on the first surface 72 of printed circuit board 64 so as to substantially surround the electronic package 10. The EMI shield 42 may be coupled to the external ground trace 52 so as to electrically couple the EMI shield 42 to the grounded layer(s) 68 through vias 70. For many smaller electronic devices (cell phones, PDA's etc.) the surface ground traces are generally between 1 mm and 2 mm wide (~0.040" to 0.080"). However, ground traces could be 4 mm (0.160") wide or greater in some cases of larger electronic devices. Vias 70 may be positioned at any location along the width of the ground trace 52 although the vias are generally centered along the width of the ground trace.

As shown in FIG. 8, the present invention also encompasses a printed circuit board 64 in which the surface ground traces are removed, and the EMI shield 42 is grounded directly to an upper end portion of the vias 70. Such an embodiment reduces the amount of elements on the surface 68 of the printed circuit board. For example, removing the surface ground trace 52, which can be between 0.040"–0.080" wide, and contacting EMI shield 14 directly to the vias (which have a diameter ~0.028") saves approximately 0.012" to 0.52" of printed circuit board area which could be used for additional component placement or to reduce the overall dimensions of the printed circuit board and the electronic device.

In this particular example, in which the embodiment of FIG. 1 is illustrated, the grounding solder balls 52 that are electrically coupled to EMI shield 42 would directly contact the metallized surface of the vias 70 which generally have a portion of the plated metal coating extending onto the flat surface 68 of the printed circuit board.

As can be appreciated by those of ordinary skill in the art, while the package 10 of FIG. 1 is illustrated for use with a printed circuit board 64 that does not have a surface ground trace (FIG. 8), and the package 10 of FIG. 4 is illustrated for use with a printed circuit board 64 with a surface ground trace 52 (FIG. 7), all of the embodiments of the present invention may be used with both types of printed circuit boards.

For example, if the package 10 of FIG. 4 is used with a printed circuit board 64 without a surface ground trace 52, to enhance the electrical connection between the metallized end 63 and the via, small dimples or depressions (not shown) may be formed into the flange 48 of the EMI shield and protrude toward the printed circuit board so as to align and mate with the via locations. The dimple would extend into the inner diameter of the vias. An alternative method of attaching and grounding EMI shield 42 to the vias would be to use conductive materials or adhesives to attach the ends 63 of EMI shield 42 in the proper orientation and location to make proper electrical connection to the vias 70. This would allow for the use droplets of adhesive on the locations of the vias and place the shield onto the droplets thereby making the electrical connection between EMI shield 42 and the vias. Alternatively, the droplets of adhesive may be placed on EMI shield 42 in a pattern that corresponds to the vias 70 and then place the package 10 and adhesive coated EMI shield 42 onto the printed circuit board 64.

A more complete description of grounding an EMI shield to a ground plane through the use of strategically formed vias in a printed circuit board is described in commonly owned, and co-pending U.S. patent application Ser. No. 10/825,999, entitled "Electromagnetic Interference Shielding for a Printed Circuit Board," filed herewith, the complete disclosure of which is incorporated herein by reference.

Figure 9:
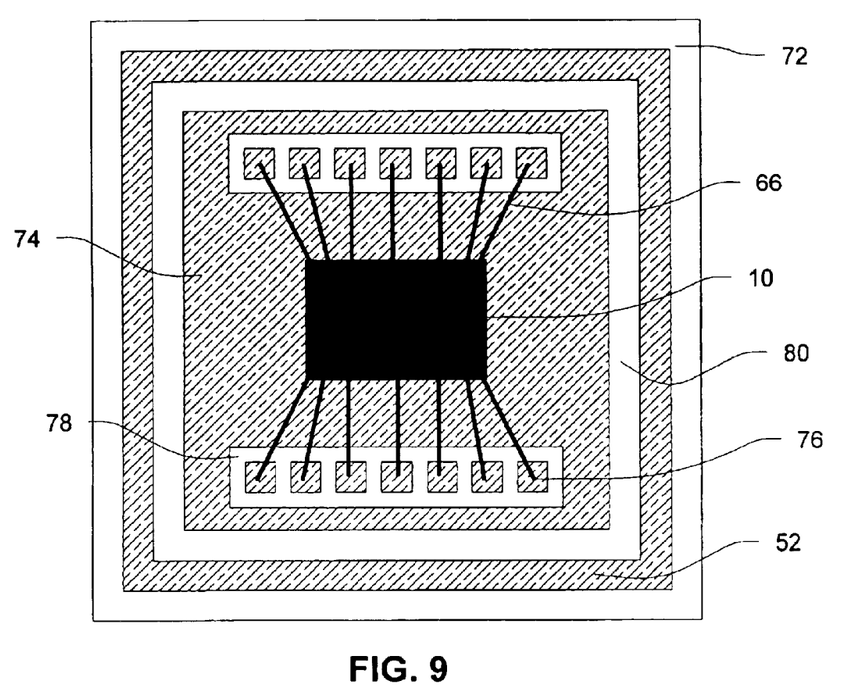
FIG. 9 illustrates another EMI shielding solution encompassed by the present invention.

FIG. 9 illustrates another shielding solution that is encompassed by the present invention. The shielding solution illustrated in FIG. 9 may be used in addition to the network of vias or as an alternative to the network of vias. As shown in FIG. 9, a portion of the surface of the printed circuit board beneath and around the electronic package 10 is plated with a conductive material 74, such as copper, nickel, gold, silver, tin, lead or combinations thereof or the like.

In this configuration, electronic package 10 is encapsulated by conformal coating 24 which is typically insulative, thus preventing electronic package from shorting with the conductive material 74. Wire bonds extending outward from electronic package 10 would extend to designated individual lead pads 76 to create the desired electrical pathways for package 10. If conformal coating is not used to insulate the bottom of electronic package 10, an alternative method for preventing shorting of the package 10 would be to apply an insulative material such as PBT, polycarbonate, Ultem®, Teflon®, Kapton®, polypyrroyle, fluorocarbons or the like to protect package 10 from shorting out on the exposed conductive material 74.

Preferably, the conductive material 74 may be the same material as the ground trace 52. As can be seen, individual lead pads 76 may be positioned on the surface of the printed circuit board 64 and surrounded by a non-conductive surface 78 (such as the surface of the printed circuit board or another insulative material). As such, the lead frame 66 of the electronic package 10 may still contact the lead pads 76 on the printed circuit board 64, and the conductive material 74 will not interfere with the signal path or signal quality. While not shown, conductive material 74 may be in electrical contact with vias or other conductive elements that allow the conductive material to be grounded to a grounded layer, such as a ground plane.

If desired, the EMI shield may be directly coupled to the conductive material 74 to ground the EMI shield. In such embodiments, the ground trace 52 will not be needed. In other embodiments, however, the EMI shield may be grounded to the ground trace 52 and will not be in contact with the conductive material 74. In such embodiments, conductive material 74 will be separated from ground trace 52 with an insulative space 80.

While the figures of the present invention illustrate a plurality of different electronic component package configurations, it should be appreciated that the concepts of the present invention may be applicable to other types of chip and package configurations. For example, the present invention may readily be adapted for use with small outline packages (SOP), thin small outline packages (TSOP), small outline J leaded package (SOJ), quad flat packages (QFP), quad flat J leaded package (QFJ), quad flat pack non-leaded package (QFN), tape carrier packages (TFP), or ball grid array packages such as flip-chip ball grid arrays (FC-BGA), tape-automated bonding ball grid arrays (TAB-BGA), enhanced ball grid arrays (EBGA), fine pitch ball grid arrays (FBGA), face-down, and heat-enhanced ball grid arrays (FDB-BGA).

While the preferred embodiments of the present invention have been described, a person of ordinary skill in the art will recognize that various modifications, substitutions and equivalents may be used without departing from the spirit and scope of the present invention. For example, it may be possible to replace the conductively coated polymer shield with a shaped metal can. Moreover, any of the above chip packages may optionally comprise a heat sink or heat spreader (not shown) that is coupled to a non-active surface of the die.

What is claimed is:

1. A shielded electronic package comprising:
    a die;
    a substrate comprising a plurality of traces;
    a plurality of leads that electrically couple an active surface of the die to the plurality of traces in the substrate;
    external solder ball contacts coupled to the traces in the substrate, wherein the solder ball contacts extend from a surface of the substrate and are configured to be coupled to conductive leads on a printed circuit board;
    a conductively coated polymer shield that defines a cavity around at least a portion of the die and the plurality of leads, wherein the conductively coated polymer shield is electrically coupleable to a ground trace; and
    an insulative conformal coating disposed over the conductively coated polymer shield so as to encapsulate the die and plurality of leads, wherein the insulative conformal coating leaves the external solder ball contacts exposed.

2. The shielded electronic package of claim 1 wherein the ground trace is disposed in the substrate and is in electrical communication with some of the external solder ball contacts.

3. The shielded electronic package of claim 2 wherein a portion of the conductively coated polymer shield is electrically coupled to the ground trace with a conductive adhesive.

4. The shielded electronic package of claim 1 wherein the ground trace is disposed on a surface of the printed circuit board, wherein an end portion of the conductively coated polymer shield extends beyond an outer surface of the conformal coating and the substrate, and is configured to contact the surface ground trace on the printed circuit board.

5. The shielded electronic package of claim 1 wherein the conductively coated polymer shield comprises a top surface and a plurality of side walls,
    wherein a flange extends at an angle from the side walls in a plane that is substantially parallel with the first surface of the substrate.

6. The shielded electronic package of claim 5 wherein the conductively coated polymer shield comprise a thermoplastic resin layer and at least one metal layer on at least one surface of the resin layer.

7. The shielded electronic package of claim 6 wherein the metal layer has a thickness between about 1 micron and about 50 microns.

8. The shielded electronic package of claim 6 wherein the metal layer comprises a vacuum deposited metal coating.

9. The shielded electronic package of claim 6 wherein the metal layer is disposed on a surface of the thermoplastic resin layer that is facing the die and the substrate, wherein the metal layer electrically contacts the ground trace.

10. The shielded electronic package of claim 5 wherein the thermoplastic resin layer comprises a high temperature thermoformable film.

11. The shielded electronic package of claim 1 wherein the conductively coated polymer shield comprises a plurality of apertures.

12. The shielded electronic package of claim 11 wherein the apertures are positioned and sized to allow the plurality of leads to be electrically coupled to the plurality of traces in the substrate.

13. The shielded electronic package of claim 1 wherein the conductively coated polymer shield creates a spacing between the conformal coating and the die.

14. The shielded electronic package of claim 13 wherein the cavity is sized to receive a heat sink that is coupled to the die.

15. The shielded electronic package of claim 14 further comprising a plurality of vias that extend through the conductively coated polymer shield and the heat sink, wherein the conformal coating fills in the plurality of vias.

16. The shielded electronic package of claim 1 further comprising a filler material disposed in the spacing between the die and the conductively coated polymer shield.

17. The shielded electronic package of claim 16 wherein the filler material has a coefficient of thermal expansion similar to the coefficient of thermal expansion of the electronic die it encapsulates.

18. The shielded electronic package of claim 16 wherein the filler material comprises a coefficient of thermal expansion similar to the coefficient of thermal expansion of the conformal coating.

19. The shielded electronic package of claim 1 wherein the conductively coated polymer shield comprises a plurality of layered conductively coated polymer layers.

20. The shielded electronic package of claim 1 wherein the plurality of leads that electrically couple the active surface of the die to the plurality of traces in the substrate comprise an array of solder bumps.

21. The shielded electronic package of claim 1 wherein the plurality of leads that electrically couple the active surface of the die to the plurality of traces in the substrate comprise a plurality of elongated wires.

22. A shielded package comprising:
a die comprising an active surface;
a substrate comprising a plurality of traces;
a plurality of leads that electrically couple the active surface of the die to the plurality of traces in the substrate;
external contacts coupled to the traces in the substrate, wherein the external contacts are configured to be coupled to conductive leads on a printed circuit board;
a conductively coated polymer shield that defines a cavity around at least a portion of the die, wherein the conductively coated polymer shield is electrically coupleable to a ground trace in the substrate;
a filler material disposed within the cavity defined by the conductively coated polymer shield; and
a conformal coating disposed over the conductively coated polymer shield so as to encapsulate the die and plurality of leads, wherein the insulative conformal coating leaves the external solder ball contacts exposed.

23. The shielded package of claim 22 wherein the filler material comprises a heat spreader.

24. The shielded package of claim 23 wherein the heat spreader and the conductively coated polymer shield comprise a plurality of vias, wherein the conformal coating fills the plurality of vias.

25. The shielded package of claim 22 wherein the external contacts comprise pads and a solder ball bump.

26. The shielded package of claim 22 wherein the conductively coated polymer shield comprises a top surface and a plurality of side walls,
wherein a flange extends at an angle from the side walls in a plane that is substantially parallel with the first surface of the substrate.

27. The shielded package of claim 26 wherein the conductively coated polymer shield comprise a thermoplastic resin layer and at least one metal layer on at least one surface of the resin layer.

28. A method of manufacturing a shielded package comprising:
providing a substrate comprising a plurality of leads;
electrically coupling an active face of a die to the plurality of leads;
coupling a conductively coated resin layer to the substrate so that the die is positioned in a cavity between the substrate and the conductively coated resin layer;
grounding the conductively coated resin layer; and
applying a conformal coating over at least a portion of the conductively coated resin layer so as to encapsulate the die and at least a portion of the substrate.

29. The method of claim 28 further comprising forming the conductively coated resin layer by shaping a resin layer and depositing at least one conductive layer onto at least one surface of the shaped resin layer.

30. The method of claim 28 further comprising filling the cavity with a filler material.

31. The method of claim 28 further comprising attaching an array of solder ball bumps to an exposed pads of the substrate.

32. The method of claim 28 wherein grounding the conductively coated resin layer comprises extending a portion of the conductively coated resin layer outside of the conformal coating and contacting the conductively coated resin layer to a ground trace on a printed circuit board.

33. The method of claim 28 further comprising coupling a heat sink to the die.

* * * * *